(12) United States Patent
Wang et al.

(10) Patent No.: US 7,548,121 B2
(45) Date of Patent: Jun. 16, 2009

(54) FRACTIONAL FREQUENCY SYNTHESIZER AND PHASE LOCKED LOOP UTILIZING FRACTIONAL FREQUENCY SYNTHESIZER AND METHOD THEREOF

(75) Inventors: Wen-Chi Wang, Yun-Lin Hsien (TW); Tze-Chien Wang, Taipei (TW)

(73) Assignee: Realtek Semiconductor Corp., HsinChu (TW)

( * ) Notice: Subject to any disclaimer, the term of this patent is extended or adjusted under 35 U.S.C. 154(b) by 261 days.

(21) Appl. No.: 11/465,451

(22) Filed: Aug. 18, 2006

(65) Prior Publication Data

US 2007/0040940 A1  Feb. 22, 2007

(30) Foreign Application Priority Data

Aug. 18, 2005  (TW) .............................. 94128226 A

(51) Int. Cl.
*H03L 7/00* (2006.01)
(52) U.S. Cl. ................................ 331/11; 331/2; 331/16; 331/18; 331/20
(58) Field of Classification Search ...................... 331/2, 331/11, 18, 20, 16
See application file for complete search history.

(56) References Cited

U.S. PATENT DOCUMENTS

| | | | |
|---|---|---|---|
| 6,219,397 B1 | 4/2001 | Park | |
| 6,686,784 B2 | 2/2004 | Chang | |
| 6,823,133 B1 | 11/2004 | Adkins | |
| 6,844,836 B1 | 1/2005 | Lee | |
| 6,914,464 B2 | 7/2005 | Maeda | |
| 6,961,400 B1 * | 11/2005 | Huff et al. ................... | 375/376 |
| 7,231,010 B2 * | 6/2007 | Smith ......................... | 375/376 |

* cited by examiner

*Primary Examiner*—Arnold Kinkead
(74) *Attorney, Agent, or Firm*—Winston Hsu

(57) ABSTRACT

A fractional frequency synthesizer, applied to a phase-locked loop, includes a phase detector, a loop filter, a controllable oscillator, a first frequency divider, and a sigma-delta modulator (SDM). The phase detector generates a phase difference signal according to a reference signal and a feedback signal. The loop filter filters the phase difference signal to generate a filtered signal. The controllable oscillator generates the frequency signal according to the filtered signal. The first frequency divider generates the feedback signal by dividing a frequency of the frequency signal according to a dividing factor. The SDM determines the dividing factor according to a control signal.

16 Claims, 3 Drawing Sheets

FRACTIONAL FREQUENCY SYNTHESIZER AND PHASE LOCKED LOOP UTILIZING FRACTIONAL FREQUENCY SYNTHESIZER AND METHOD THEREOF

BACKGROUND OF THE INVENTION

1. Field of the Invention

The invention relates to a frequency synthesizer, and more particularly, to a fractional frequency synthesizer.

2. Description of the Prior Art

Please refer to FIG. 1. FIG. 1 is a block diagram of a conventional phase-locked loop (PLL) 100. The PLL 100 is used for generating a frequency signal $S_{f1}$ according to an input signal $S_{in1}$. As shown in FIG. 1, the PLL 100 includes a phase detector (PD) 110, a loop filter 120, a voltage-controlled oscillator (VCO) 130, and a frequency divider 140. However, there is a dilemma when considering the practical circuit design of the conventional PLL 100. Suppose that the input signal $S_{in1}$ is a low-frequency signal and the frequency signal $S_{f1}$ is a high-frequency signal. When considering the input signal $S_{in1}$, the loop bandwidth of the PLL 100 should be designed to be narrow enough to filter out the jitter of the input signal $S_{in1}$; however, when considering the frequency signal $S_{f1}$ from the VCO 130, the loop bandwidth of the PLL 100 should be wide enough to eliminate the jitter of the frequency signal $S_{f1}$ due to the VCO. In a general implementation, the frequency ratio of the frequency signal $S_{f1}$ to the input signal $Si_{in1}$ of the conventional PLL 100 differs roughly by a factor of tens. In a liquid crystal display (LCD) controller circuit, however, the input signal $S_{in1}$ is a reference signal (i.e., a horizontal synchronization signal, HSYNC). In this case, the frequency of the reference signal can be tens of KHz (e.g. 30~100 KHz), but the frequency of the frequency signal $S_{f1}$ can be up to hundreds of MHz (e.g. 25~200 MHz). Therefore, the frequency ratio of the frequency signal $S_{f1}$ to the input signal $S_{in1}$ differs roughly by a factor of thousands. In this situation, the PLL 100 will fail to effectively eliminate the jitter of the frequency signal $S_{f1}$ due to the VCO and the input signal $S_{in1}$ at the same time.

U.S. Pat. No. 6,686,784 discloses a hybrid phase-locked loop to solve the above-mentioned problem. To effectively eliminate jitter of both the frequency and the input signal, however, the prior art hybrid phase-locked loop is composed of two analog phase-locked loops and one phase selector, resulting in increased manufacturing cost and higher circuit complexity.

SUMMARY OF THE INVENTION

Therefore, it is one of the objectives of the claimed invention to provide a frequency signal generator utilizing a fractional frequency synthesizer and method thereof, to solve the above-mentioned problem.

One objective of the claimed invention is to provide a frequency signal generator, wherein the frequency ratio of the frequency signal to the input signal is not an integer.

Another objective of the claimed invention is to provide a frequency signal generator whose digital circuit part can reduce the jitter of the input signal to obtain the desired loop bandwidth.

A further objective of the claimed invention is to provide a fractional frequency synthesizer for reducing the jitter of the output signal.

A further objective of the claimed invention is to provide a frequency signal generator for reducing circuit complexity and manufacturing cost.

These and other objectives of the present invention will no doubt become obvious to those of ordinary skill in the art after reading the following detailed description of the preferred embodiment that is illustrated in the various figures and drawings.

DETAILED DESCRIPTION

The present invention discloses a hybrid phase-locked loop specifically suitable for utilizing an input signal to lock a frequency signal, where the frequency ratio between the frequency signal and the input signal is extremely large. It should be noted, however, that the present invention is not limited to this application.

Figure 1:
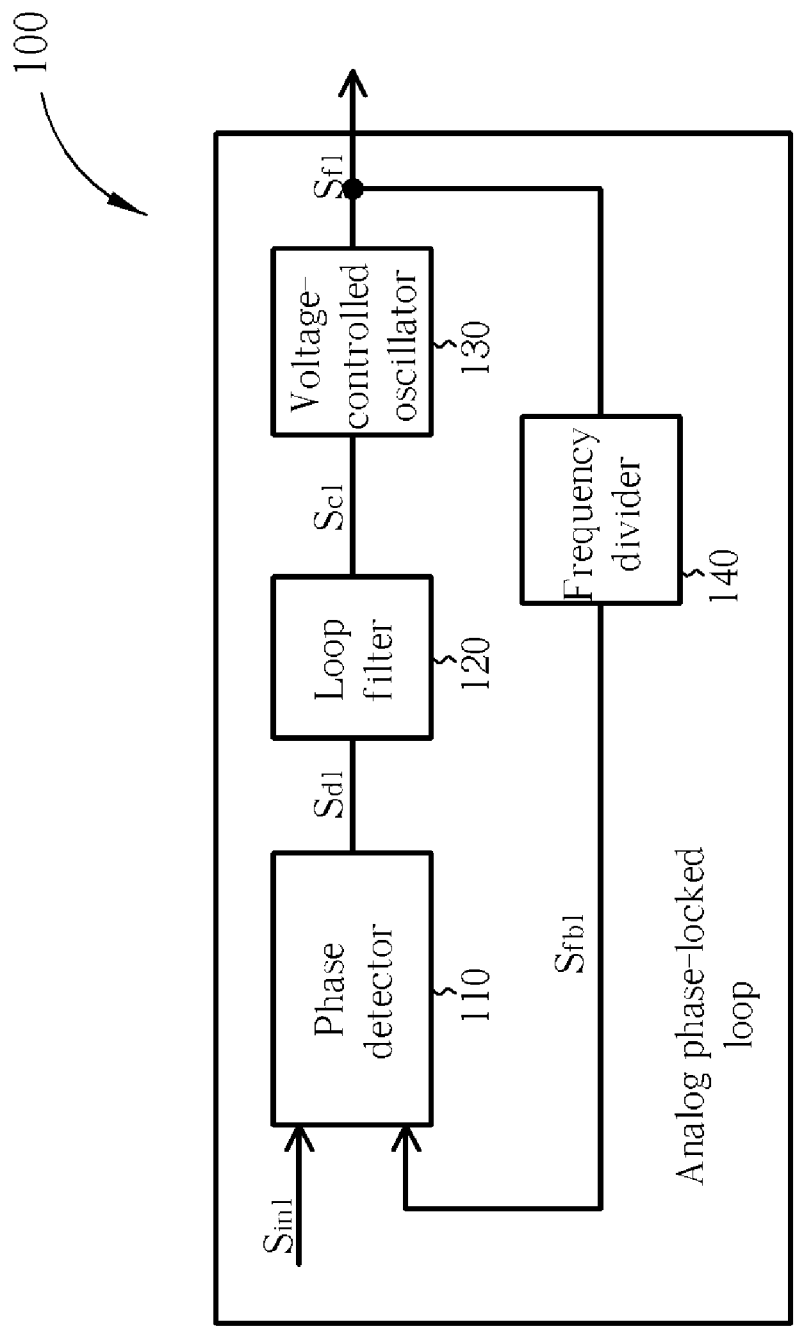
FIG. 1 is a block diagram of a conventional phase-locked loop.
Figure 2:
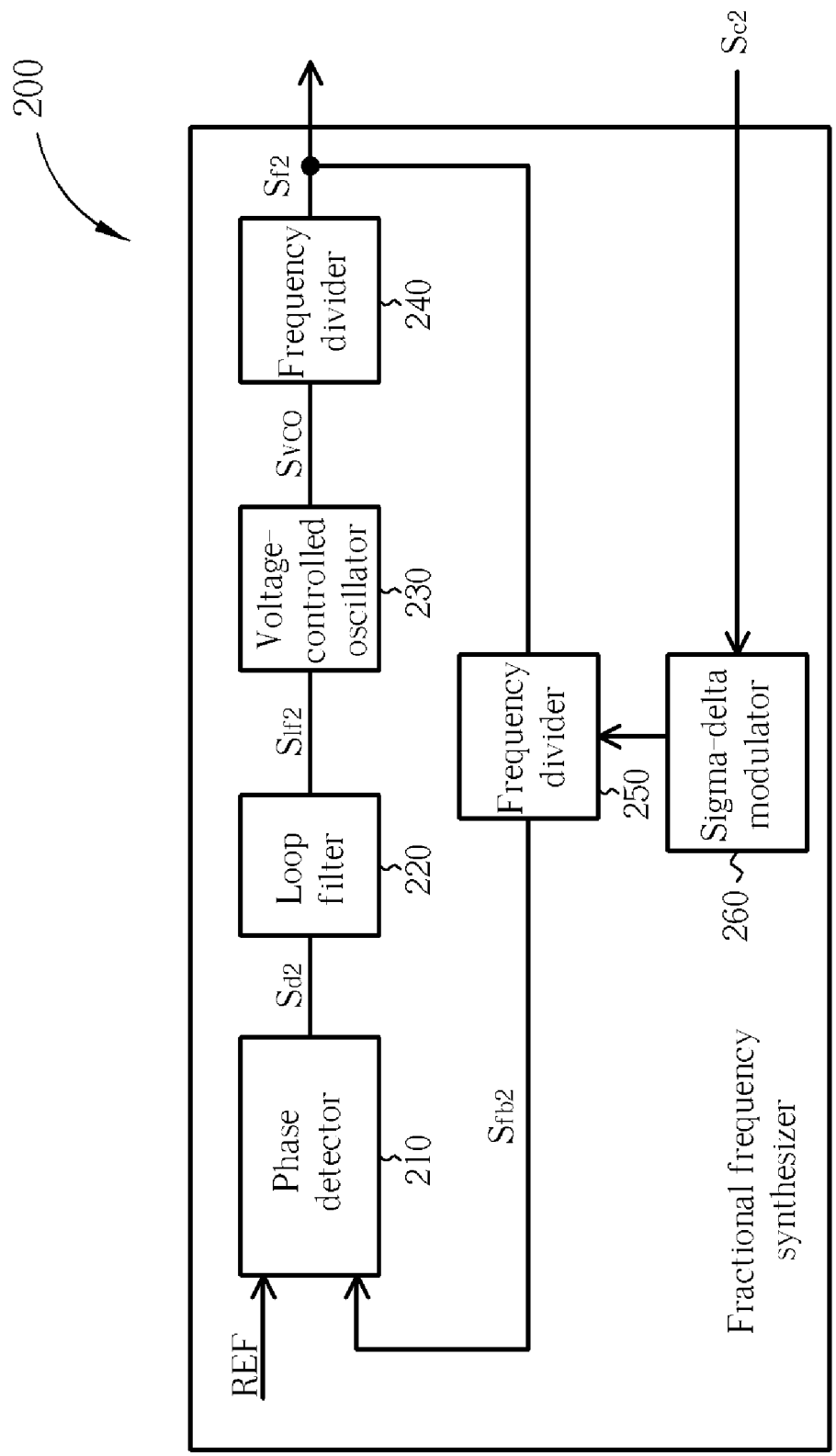
FIG. 2 is a block diagram of a fractional frequency synthesizer according to an embodiment of the present invention.

Please refer to FIG. 2. FIG. 2 is a block diagram of a fractional frequency synthesizer 200 according to an embodiment of the present invention. In this embodiment, the fractional frequency synthesizer 200 generates a frequency signal $S_{f2}$ according to a reference signal REF and a control signal $S_{c2}$, where the frequency of the frequency signal $S_{f2}$ is not an integer multiple of the reference signal REF. As shown in FIG. 2, the fractional frequency synthesizer 200 comprises: a phase detector 210, a loop filter 220, a voltage-controlled oscillator 230, a plurality of frequency dividers 240, 250, and a sigma-delta modulator (SDM) 260. The phase detector 210 compares phases of the reference signal REF and the feedback signal $S_{fb2}$ to generate a phase difference signal $S_{d2}$. The loop filter 220 receives the phase difference signal $S_{d2}$ and then outputs a filtered signal $S_{lf2}$ to the following voltage-controlled oscillator 230. The voltage-controlled oscillator 230 generates an oscillating signal $S_{vco}$ according to the filtered signal $S_{lf2}$. The frequency divider 240 then performs integral frequency division upon the oscillating signal $S_{vco}$ to generate the frequency signal $S_{f2}$, which is further fed into the frequency divider 250. The frequency divider 250 then generates the feedback signal $S_{fb2}$ after performing integral frequency division on the frequency signal $S_{f2}$. Please note that the frequency dividing factor N(t) used by the frequency divider 250 is a time-varying integer, and the sigma-delta modulator 260 determines the frequency dividing factor N(t). In this embodiment, the sigma-delta modulator 260 firstly determines a non-integer frequency dividing factor M according to the control signal $S_{c2}$, and then determines the frequency dividing factor N(t) according to the non-integer frequency dividing factor M so as to make an average of values of the frequency dividing factor N(t) at different timings equal to the non-integer frequency dividing factor M. The relationship of the frequency $F_{REF}$ of the reference signal REF and the frequency $F_{f2}$ of the frequency signal $S_{f2}$ satisfies the following equation:

$$F_{f2} = M * F_{REF}$$

In an embodiment, the reference signal REF can be a low-jitter frequency signal. Therefore, the loop bandwidth can be large to suppress the jitter of VCO, and results in a low-jitter frequency signal $Sf_2$.

In the fractional frequency synthesizer 200, since the frequency dividing factor N(t) used by the frequency divider 250 is a time-varying integer, the frequency of the feedback signal $S_{fb2}$ will change with time so the phase difference signal $S_{d2}$ is also a signal with a certain degree of frequency variation. However, after the phase difference signal $S_{d2}$ is filtered by the loop filter 220, the filtered signal $S_{lf2}$ generated by the loop filter 220 could be a stable signal to drive the voltage-controlled oscillator 230 to generate the stable oscillating signal $S_{vco}$. In other words, the frequency signal $S_{f2}$ outputted from the frequency divider 240 is a stable signal as well. Please note that the frequency divider 240 is an integral frequency divider and can be omitted in other embodiments of the present invention.

Figure 3:
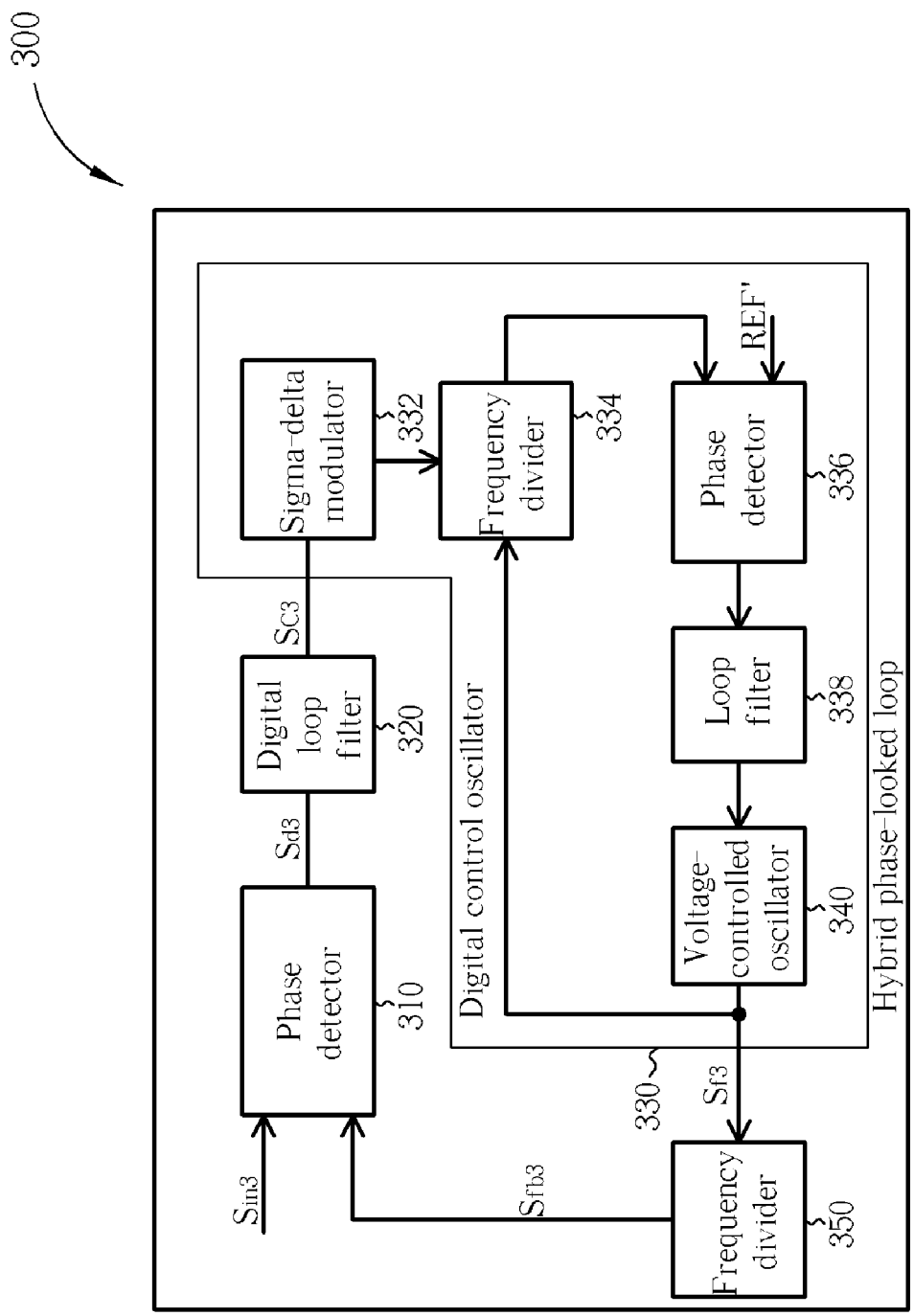
FIG. 3 is a block diagram of a fractional frequency synthesizer, applied to a frequency signal generator, according to an embodiment of the present invention.

Please refer to FIG. 3. FIG. 3 is a block diagram of a frequency signal generator (hybrid phase-locked loop) 300 utilizing the aforementioned fractional frequency synthesizer 200 according to an embodiment of the present invention. The frequency signal generator 300 locks a frequency signal $S_{f3}$ according to an input signal $S_{in3}$. As shown in FIG. 3, the frequency signal generator 300 comprises a phase detector (PD) 310, a digital loop filter 320, a digitally controlled oscillator (DCO or NCO) 330, and a frequency divider 350. The phase detector 310 receives an input signal $S_{in3}$ and a feedback signal $S_{fb3}$, and then compares phases of the input signal $S_{in3}$ and the feedback signal $S_{fb3}$ to output a phase difference signal $S_{d3}$. The digital loop filter 320 receives the phase difference signal $S_{d3}$ and outputs a control signal $S_{c3}$ to the digitally controlled oscillator 330, and the digital control oscillator 330 adjusts a frequency signal $S_{f3}$ according to the control signal $S_{c3}$. The frequency signal $S_{f3}$ is fed to the frequency divider 350. The feedback signal $S_{fb3}$ is generated after the frequency signal $S_{f3}$ is frequency-divided. In this embodiment, the digitally controlled oscillator 330 is implemented by a fractional frequency synthesizer, and comprises a sigma-delta modulator 332, a frequency divider 334, a phase detector 336, a loop filter 338 and a voltage-controlled oscillator 340. The digitally controlled oscillator 330 shown in FIG. 3 is substantially identical to the fractional frequency synthesizer 200 shown in FIG. 2. Therefore, further description is omitted for brevity. Please note that the frequency divider 350 can be omitted according to practical circuit requirements. Furthermore, the output signal of the digitally controlled oscillator 330, i.e. the frequency signal $S_{f3}$, can be firstly processed by an additional frequency divider and then outputted according to practical design requirements.

The frequency signal generator 300 of the present invention can be applied to lock a frequency signal according to a horizontal synchronization signal (HSYNC) of a video signal, where the frequency signal is associated with pixels. Although the frequency difference between the horizontal synchronization signal and the frequency signal is extremely large, the frequency signal generator 300 can still lock the frequency signal easily and reduce the jitter of both the horizontal synchronization signal and the controlled oscillator efficiently. Furthermore, it will be obvious to those skilled in the art that the frequency signal generator 300 of the present invention can also be applied to locking a frequency signal according to other periodical signal of a video signal (e.g., a vertical synchronization signal (VSYNC)) or can also be applied to any frequency synthesis application when the suppression of jitters at least one from the reference frequency and the controlled oscillator is required.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A frequency signal generator, comprising:
   a first phase detector configured to receive an input signal and a first feedback signal and generate a first phase difference signal according to the input signal and the first feedback signal;
   a first loop filter, coupled to the first phase detector, configured to filter the first phase difference signal to generate a control signal; and
   a fractional frequency synthesizer, coupled to the first loop filter and the first phase detector, configured to adjust the first feedback signal according to the control signal;
   wherein the fractional frequency synthesizer comprises:
      a second phase detector configured to receive a reference signal and a second feedback signal to generate a second phase difference signal;
      a second loop filter, coupled to the second phase detector, configured to filter the second phase difference signal to generate a filtered signal
      a controllable oscillator, coupled to the second phase detector, configured to generate a frequency signal according to the filtered signal;
      a first frequency divider, coupled to the controllable oscillator, configured to divide a frequency of the frequency signal to generate the second feedback signal; and
      a modulator, coupled to the first frequency divider and the first loop filter, configured to generate a sigma-delta output signal according to the control signal and determine a frequency dividing factor of the first frequency divider according to the sigma-delta output signal.

2. The frequency signal generator of claim 1, further comprising:
   a second frequency divider, coupled between the fractional frequency synthesizer and the first phase detector, configured to divide the frequency of the frequency signal to generate the first feedback signal.

3. The frequency signal generator of claim 2, wherein the frequency divider is an integral frequency divider.

4. The frequency signal generator of claim 1, wherein the frequency dividing factor is a time-varying integer, and an average of values of the frequency dividing factor is a non-integer.

5. The frequency signal generator of claim 1, wherein the input signal is a synchronization signal of a video signal.

6. A method for generating a frequency signal, comprising:
   receiving an input signal and a first feedback signal, and generating a first phase difference signal according to the input signal and the first feedback signal;
   filtering the first phase difference signal to generate a control signal; and
   adjusting the first feedback signal according to the control signal in a fractional frequency synthesizer;
   wherein the step of adjusting the first feedback signal comprises:
      receiving a reference signal and a second feedback signal, and generating a second phase difference signal according to the reference signal and the second feedback signal;
   filtering the second phase difference signal to generate a filtered signal;
   generating a frequency signal according to the filter signal;
   determining a frequency dividing factor according to the control signal; and dividing a frequency of the frequency signal according to the frequency dividing factor to generate the second feedback signal.

7. The method of claim 6, further comprising:
dividing a frequency of the frequency signal to generate the first feedback signal;
wherein the first phase difference signal is generated according to a phase difference between the input signal and the first feedback signal.

8. The method of claim 7, wherein dividing the frequency of the frequency signal is performed by an integral frequency dividing operation.

9. The method of claim 6, wherein the frequency dividing factor is a time-varying integer, and an average of values of the frequency dividing factor is a non-integer.

10. The method of claim 6, wherein a frequency of the reference signal is a non-integer multiple of a frequency of the frequency signal, and the step of adjusting the frequency signal further comprises:
adjusting the non-integer multiple according to the control signal.

11. The method of claim 10, wherein the input signal is a synchronization signal of a video signal.

12. The frequency signal generator of claim 1, wherein the first feedback signal is the frequency signal.

13. The method of claim 6, wherein the first feedback signal is the frequency signal.

14. A method for generating a frequency signal, comprising:
receiving an input signal and a first feedback signal, and generating a first phase difference signal according to the input signal and the first feedback signal;
filtering the first phase difference signal to generate a control signal; and
adjusting the first feedback signal according to the control signal in a fractional frequency synthesizer;
wherein the step of adjusting the first feedback signal comprises:
receiving a reference signal to output the frequency signal, wherein a frequency of the reference signal is a non-integer multiple of a frequency of the frequency signal; and
adjusting the non-integer multiple according to the control signal.

15. The method of claim 14, further comprising:
dividing a frequency of the frequency signal to generate the first feedback signal.

16. The method of claim 14, wherein the first feedback signal is the frequency signal.

* * * * *